United States Patent [19]
Ito et al.

[11] Patent Number: 6,040,228
[45] Date of Patent: Mar. 21, 2000

[54] CAPACITANCE-FORMING METHOD

[75] Inventors: Fumihito Ito; Guoliang Shou, both of Tokyo, Japan

[73] Assignee: Yozan, Inc., Tokyo, Japan

[21] Appl. No.: 08/871,536

[22] Filed: Jun. 9, 1997

[30] Foreign Application Priority Data

Jun. 7, 1996 [JP] Japan ................................. 8-168589

[51] Int. Cl.[7] .......................................... H01L 21/8242
[52] U.S. Cl. .................................... 438/393; 438/129
[58] Field of Search ................................. 438/128, 129, 438/250, 393, 599

[56] References Cited

U.S. PATENT DOCUMENTS

| | | | |
|---|---|---|---|
| 4,949,305 | 8/1990 | Toyama et al. | 365/185.12 |
| 5,457,064 | 10/1995 | Lee | 438/253 |
| 5,744,385 | 4/1998 | Hojabri | 438/250 |

FOREIGN PATENT DOCUMENTS

| | | |
|---|---|---|
| 698 927 | 2/1996 | European Pat. Off. . |
| 704 904 | 4/1996 | European Pat. Off. . |
| 7 211 860 | 8/1995 | Japan . |

*Primary Examiner*—Chandra Chaudhari
*Attorney, Agent, or Firm*—Pillsbury Madison & Sutro LLP

[57] ABSTRACT

The present invention reduces the circuit area of a semiconductor system including a capacitance. To realize it, a unit capacitor electrode conductor is curved to detour a metal terminal head portion used for common electrode, the metal terminal head portion for a common electrode is chamfered, or the cyclic position of a row of adjacent unit capacitor electrodes is shifted.

6 Claims, 4 Drawing Sheets

CAPACITANCE-FORMING METHOD

FIELD OF THE INVENTION

The present invention relates to a capacitance-forming method in a semiconductor system.

BACKGROUND OF THE INVENTION

The applicant of the present invention proposes various analog architectures in un LSI, with a view to realizing highly accurate analog data processing. This requires that both capacitance and other elements are accurate. Such accuracy in capacitance capacity is proposed with respect to the capacitance-forming method in Japanese Patent Laid-Open Publication No. 7-211860.

In Japanese Patent Laid-Open Publication No. 7-211860, adjacent unit capacitances in a two-dimensional unit capacitance are divided into independent capacitances.

FIG. 5 shows a capacitance with such a structure, in which a plurality of unit capacitances 1 are two-dimensionally arrayed and connected to a plurality of conductors 2. A common electrode faced to each unit capacitor electrode (not shown) is formed in a layer adjacent to these unit capacitor electrodes and connected to a plurality of conductors 3 formed in the same layer where conductors 2 are formed. To each unit capacitor electrode, a metal terminal-contacting portion penetrating from the layer containing a unit capacitor electrode to the layer containing conductors 2 are connected. In the layer containing conductors 2, an approximately rectangular metal terminal head 5 is connected to metal terminal-contacting portion 4. Metal terminal head 5 is shown in FIG. 6. To the common electrode, metal terminal-contacting portion 6 from the electrode layer opposite to the layer of conductors 2 is connected. In the layer of conductors 3, approximately rectangular metal terminal-contacting portion 7 is formed in metal terminal-contacting portion 6. The adjacent unit capacitor electrodes in unit capacitor electrode rows are connected to a different conductor 2 to suppress the dispersion of capacitive accuracy.

SUMMARY OF THE INVENTION

However, in such a structure, at least two conductors 2 for unit capacitor electrodes are extended along a row of unit capacitor electrodes. The circuit area is difficult to be reduced because it is necessary to maintain the distance between unit capacitor electrode conductor 2 and common electrode conductor 3 and metal terminal portions 5 and 7. This is a large obstacle to improve the integration of a semiconductor system.

The present invention solves the above problems and has an object to provide a capacitance-forming method for substantially reducing the circuit area found in the conventional technology.

In a capacitance-forming method according to the present invention, to facilitate keeping uniform distances between components, a unit capacitor electrode conductor is curved to detour around a common electrode metal terminal head portion which is chamfered, or the cyclic position of unit capacitor electrodes in adjacent rows of electrodes is shifted.

PREFERRED EMBODIMENT OF THE PRESENT INVENTION

Hereinafter, embodiments of a capacitance-forming method according to the present invention are described with reference to the attached drawings.

Figure 1:
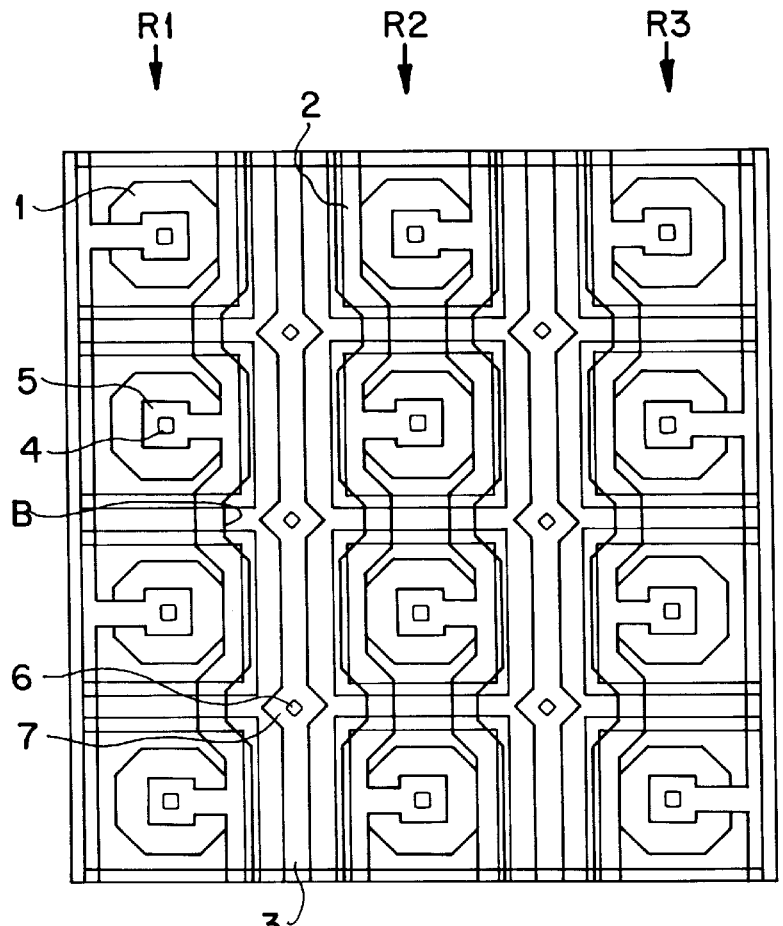
FIG. 1 is a perspective plan of the first embodiment of a capacitance-forming method according to the present invention.
Figure 5:
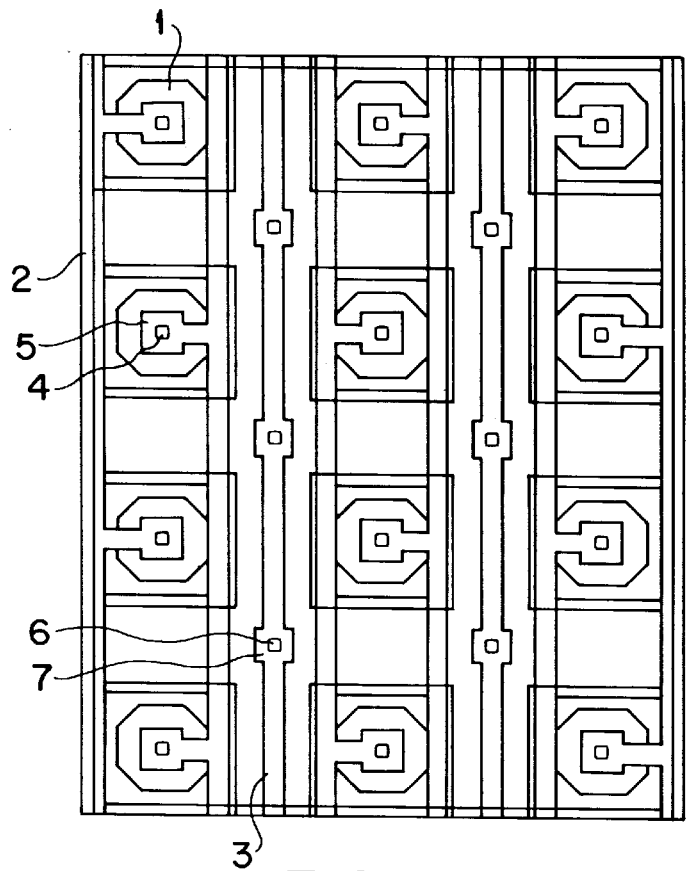
FIG. 5 shows a perspective plan of a conventional semiconductor system.
Figure 6:
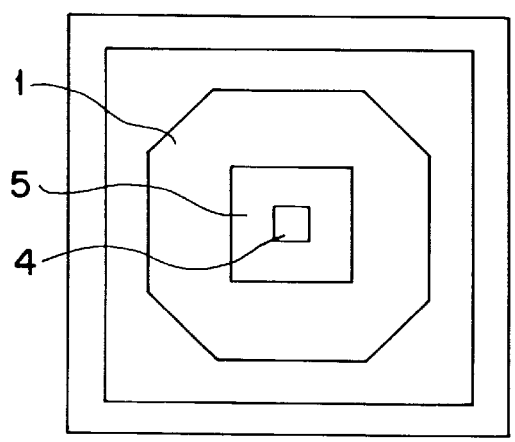
FIG. 6 is a partially enlarged semiconductor in FIG. 5.

FIG. 1 is a perspective plan of the first embodiment showing a plurality of layers of a semiconductor system, in which a part identical with or corresponding to the conventional one is added with the same symbol as that of conventional embodiment in FIG. 5.

In FIG. 1, unit capacitor electrode rows R1 to R3 are parallelly arranged, and contain a plurality of unit capacitor electrodes 1 in serial array. Metal terminal-contacting portion ("contacting portion(s)", hereinafter) 4 is connected to each unit capacitor electrode 1. Common electrodes (not shown) facing these unit capacitor electrodes are formed in a layer different to that in which unit capacitor electrode 1 is included. Contacting portion 6 is connected to each common electrode. Conductors 2 and 3 for connecting the electrodes are formed in a layer other than those in which unit capacitor electrodes 1 and common electrodes are included. Contacting portions 4 and 6 reach to the layer including the conductors by penetrating through other layers. To contacting portions 4 and 6, approximately rectangular metal terminal head portions ("head portion(s)", hereinafter) 5 and 7 are connected, respectively. Conductors 2 and 3 are connected to contacting portions 4 and 6 by the head portions.

In a unit capacitor electrode row, an adjacent unit capacitor electrode is connected to different conductors 2 resulting unit capacitances used for a capacitance dispersed. Conductors 2 are extended along both sides of each unit capacitor electrode, and conductor 3 for common electrode is extended along each unit capacitor electrode between the unit capacitor electrode rows. Contacting portion 6 for the common electrode is set at the location corresponding to the middle of the adjacent unit capacitor electrodes, that is, the location of the maximum distance from contacting portion 6.

In conductor 2 extended adjacent to conductor 3, portion B is formed near head portion 7 and curved so as to make a detour around it. This layout facilitates setting a uniform distance between curved portion B and head portion 7. This structure enables a reduction in the width between conductors 2 and 3, with a consequence reduction in the circuit area.

Head portion 7 has a shape with a diagonal side along curved portion B, that is, a square rotated by 45° so as to maintain the distance between the corner of the outside of curved portion B and conductor 3. This shape also improves circuit area reduction and integration.

Figure 2:
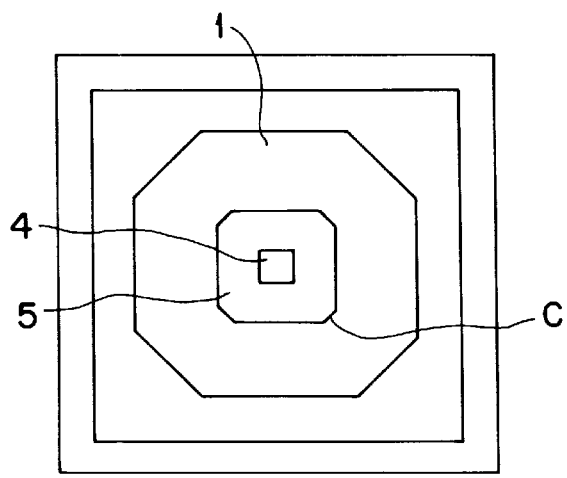
FIG. 2 shows a partially enlarged semiconductor system of the second embodiment.

FIG. 2 shows a partially-enlarged semiconductor system of the second embodiment. Head portion 5, connected to contacting portion 4 for unit capcitor electrode 1, is chamfered as shown by C. FIG. 1 shows two conductors 2 set alongside a row of unit capacitor electrodes where it is necessary to maintain the distance between one head portion 5 and conductor 3 not connected to it. Curved portion B has a part facing the corner of head portion 5 by detouring around it. Chamfered part C is effective for keeping a uniform distance between curved portion B and head portion 5.

Figure 3:
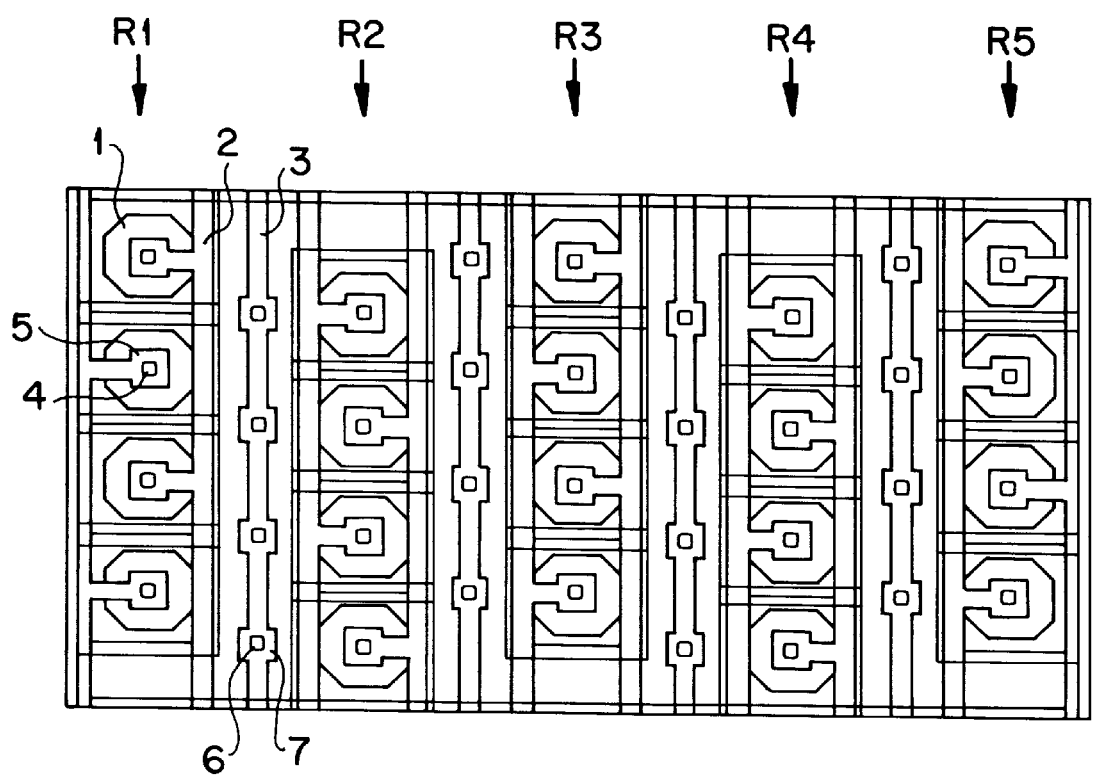
FIG. 3 is a perspective plan of the third embodiment.

FIG. 3 shows the third embodiment of the semiconductor system of the present invention. A plurality of unit capacitor electrode rows R1 to R5 are formed including a plurality of unit capacitor electrodes 1.

Similar to the first embodiment, two conductors 2 are set for each unit capacitor electrode row, and conductor 3 is set for the common electrode between these unit capacitor electrode rows.

In each unit capacitor electrode row R1 to R5, unit capacitor electrodes 1 are arrayed with a constant distance cycle which is common to all the unit capacitor electrode column. In the adjacent unit capacitor electrode column, the cyclic position is half-shifted so that each unit capacitor electrode in column direction is not in line with the adjacent one.

By this means, it is possible to reduce the distance between unit capacitances in adjacent unit capacitor electrode rows as well a to prevent electromagnetic induction on each other.

Figure 4:
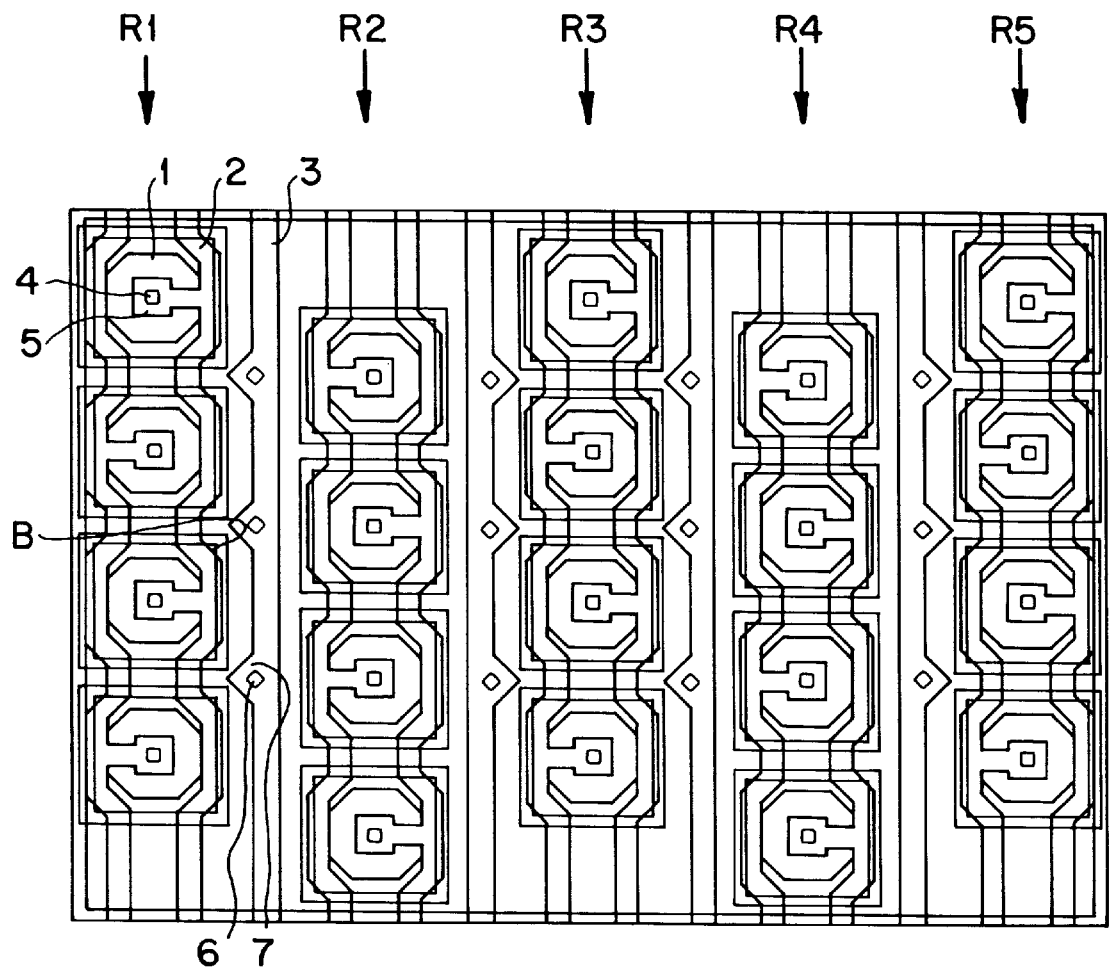
FIG. 4 is a perspective plan of the fourth embodiment.

FIG. 4 shows the fourth embodiment of the present invention with a structure combining the first and the third embodiments.

That is, in unit capacitor electrode conductor 2, extended adjacent to common electrode conductor 3, curved portion B is formed to detour around head portion 7 in the neighborhood of common electrode head portion 7 so as to provide a constant distance between curved portion B and head portion 7. The adjacent unit capacitor electrode rows are arrayed by shifting a half-cycle to keep distance between unit capacitor electrodes. Head portion 7 is a square rotated 45° to keep the distance between its outside corner and conductor 3.

Conductor 3 is laid with deflection not to pass through the centers of head portion 7 and contact portion 6, and to maintain distance from conductor 2, so as to keep a uniform distance between conductors 2 and 3.

With such a structure as above, it is easy to provide a uniform space between metal terminal 7 and conductor 2; consequently, it is possible to reduce the overall circuit area.

As mentioned above, in a capacitance-forming method according to the present invention, to facilitate setting constant distances, a unit capacitor electrode conductor is curved to detour a metal terminal head portion around a common electrode, the metal terminal head portion for this common electrode is chamfered, or the cyclic position of a row of adjacent unit capacitor electrodes in a row is shifted. Therefore, the circuit area reduction and component integration is improved compared with conventional technologics.

What is claimed is:

1. A capacitance-forming method for forming a capacitance having a predetermined capacity, comprising steps of:
   i) plurally arraying an almost straight plurality of unit capacitor electrodes in a first layer in a semiconductor system;
   ii) forming common electrodes in a second layer adjacent to said first layer to be faced to said unit capacitor electrodes;
   iii) forming a plurality of unit capacitances by ii);
   iv) forming a plurality of first and second conductors respectively connected to said first unit capacitor electrode layer and said common electrode layer in a third layer;
   v) forming first and second metal terminal-contacting portions penetrating up to said third layer respectively from said unit capacitor electrodes and common electrodes;
   vi) respectively connecting approximately rectangular first and second metal terminal head portions to said first and second metal terminal-contacting portions in said third layer;
   vii) connecting said unit capacitor electrodes and common electrodes to said first and second conductors, respectively, through said first and second metal terminal head portions, respectively;
   viii) connecting unit capacitor electrodes adjacent to each other to differnet first conductors; and
   ix) parallelly connecting a predetermined number of unit capacitances;
   wherein said first conductor adjacent to said second conductor is curved for detouring around said second metal terminal head portion.

2. A capacitance-forming method as claimed in claim 1, wherein said second metal terminal head portion has a shape including a diagonal side along the curvature of said first conductor.

3. A capacitance-forming method as claimed in claim 1, wherein said second conductor is located deflected from said second metal terminal head portion to a distance from said first conductor.

4. A capacitance-forming method as claimed in claim 1, wherein an array cyclic position of unit capacitor electrode rows adjacent to each other is approximately half shifted.

5. A capacitance-forming method for forming a capacitance having a predetermined capacity, comprising steps of:
   i) parallelly arraying an almost straight plurality of unit capacitor electrodes in a first layer in a semiconductor system;
   ii) forming common electrodes in a second layer adjacent to said first layer to be faced to said unit capacitor electrodes;
   iii) forming a plurality of unit capacitances by ii),
   iv) forming a plurality of a first and second conductors for connecting to said first unit capacitor electrode layer and said common electrode layer in a third layer;
   v) forming metal terminal-contacting portions penetrating up to said third layer respectively from said unit capacitor electrodes and common electrodes;
   vi) forming approximately rectangular metal terminal head portions in said metal terminal-contacting portions in said third layer; and
   vii) respectively connecting said metal terminal-contacting portions to said first and second conductors through said metal terminal head portion;
   wherein said metal terminal-heading portion is chamfered.

6. A capacitance-forming method for forming a capacitance having a predetermined capacity, comprising steps of:
   i) arraying a plurality of unit capacitor electrodes almost straight in a first layer in a semiconductor system;
   ii) forming common electrodes in a second layer adjacent to said first layer to be faced to said unit capacitor electrodes;
   iii) forming a plurality of unit capacitances by ii),
   iv) forming a plurality of first and second conductors for connecting said first unit capacitor electrode layer and said common electrode layer in a third layer;
   v) forming metal terminal-contacting portions penetrating up to said third layer from said unit capacitor electrode and common electrode;
   vi) forming approximately rectangular metal terminal head portions in said metal terminal-contacting portions in said third layer;

vii) respectively connecting said unit capacitor electrode and common electrode to said first and second conductors through said metal terminal head portions;

viii) connecting unit capacitor eletrodes adjacent to each other to different first conductors; and ix) parallelly connecting a predetermined number of unit capacitances;

wherein unit capacitor electrode rows adjacent to each other are shifted approximately half a cycle.

* * * * *